United States Patent [19]

Fulks

[11] Patent Number: 4,727,312

[45] Date of Patent: Feb. 23, 1988

[54] CIRCUIT TESTER

[75] Inventor: Robert G. Fulks, Phoenix, Ariz.

[73] Assignee: GenRad, Inc., Concord, Mass.

[21] Appl. No.: 812,906

[22] Filed: Dec. 23, 1985

[51] Int. Cl.⁴ .......................................... G01R 31/28
[52] U.S. Cl. ..................................... 324/73 R; 371/27
[58] Field of Search ....................... 324/73 R, 73 AT;
371/27; 364/900

[56] References Cited

U.S. PATENT DOCUMENTS

| | | | |
|---|---|---|---|
| 4,102,491 | 7/1978 | De Vito et al. | 324/73 R |
| 4,339,819 | 7/1982 | Jacobson | 324/73 R |
| 4,433,414 | 2/1984 | Carey | 371/27 |
| 4,450,560 | 5/1984 | Conner | 324/73 R |
| 4,451,918 | 5/1984 | Gillette | 371/27 |
| 4,493,079 | 1/1985 | Hughes, Jr. | 371/27 |
| 4,517,661 | 5/1985 | Graf et al. | 324/73 R |
| 4,598,245 | 7/1986 | Groves et al. | 324/73 R |
| 4,622,647 | 11/1986 | Sagnard et al. | 324/73 AT |
| 4,642,797 | 2/1987 | Hoberman | 364/900 |

FOREIGN PATENT DOCUMENTS 0011875 1/1983 Japan ................................ 324/73 R Primary Examiner—Reinhard J. Eisenzopf
Assistant Examiner—W. Burns
Attorney, Agent, or Firm—Cesari and McKenna

[57] ABSTRACT

A tester (10) for testing an electronic circuit (22) has test terminals (18a-d) that are to be connected to the terminals (20a-d) of the circuit under test. The tester terminals (18a-d) are placed in the states required for testing by formatter circuits (32a-d) in accordance with state codes generated by state-code generators (24a-d). However, the state-code generators (24a-d) are not required to generate every code as quickly as those codes are needed by the formatters (32a-d), because first-in, first-out memory stacks (30a-d) are interposed between the state-code generators (24a-d) and the formatters (32a-d). This permits the state-code generators (24a-d) to employ relatively slow—and thus relatively inexpensive—memories (26).

2 Claims, 1 Drawing Figure

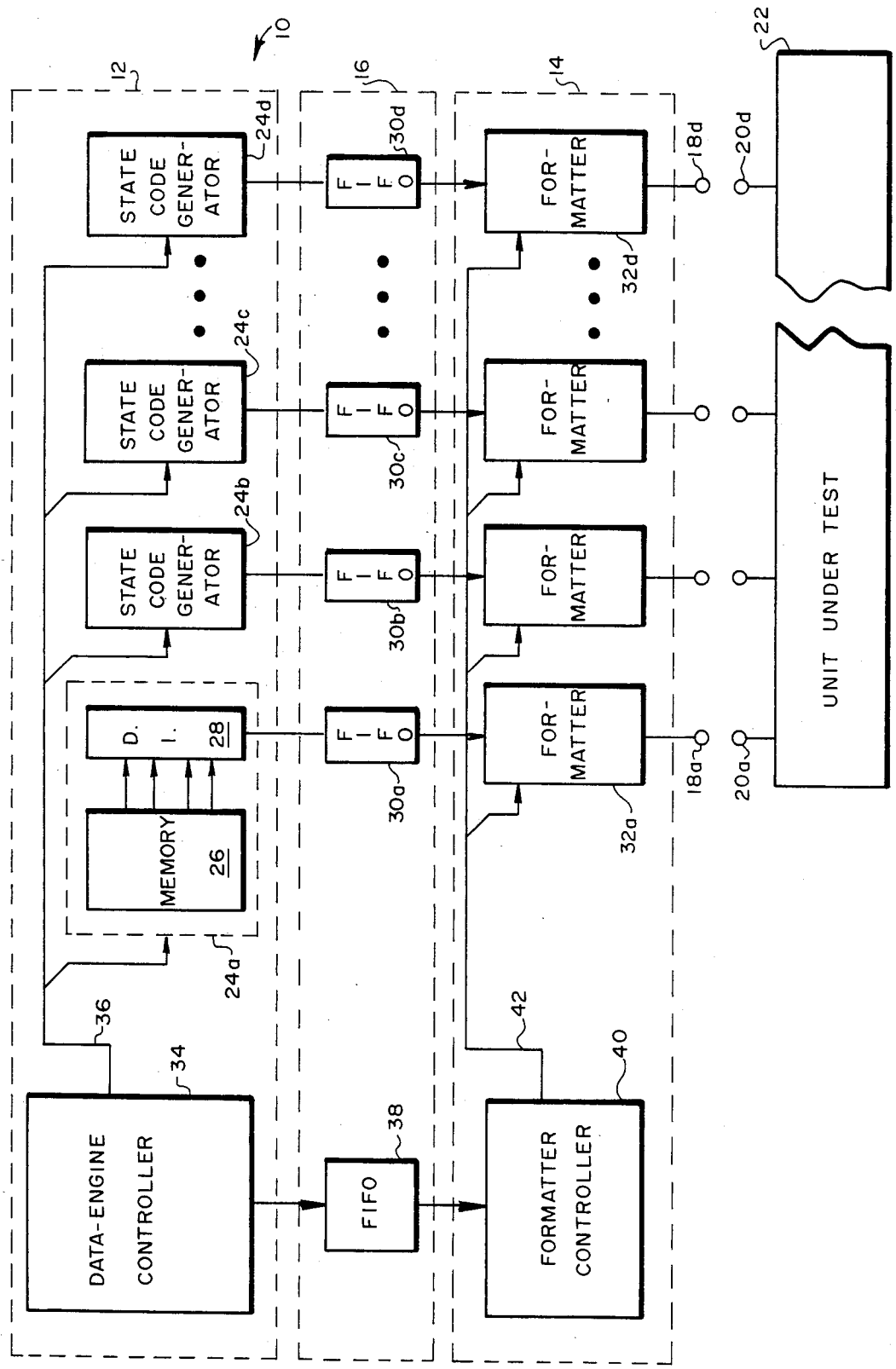

CIRCUIT TESTER

BACKGROUND OF THE INVENTION

The present invention is directed to circuit testing. It is particularly applicable to testers for testing digital circuits to which signals must be applied at a rapid rate.

The increasing complexity of digital circuits has increased the difficulty of testing them. In order to test such circuits adequately, signals must be applied to and sensed at a large number of circuit terminals simultaneously. The set of signals simultaneously applied or expected is commonly referred to as a vector, and a large string of vectors must be applied in sequence to test complex circuits adequately. Because each vector has a large number of components, and because the number of vectors is large, the memory needed to store a test program in a tester is expensive.

Contributing to this expense is the fact that the complicated digital circuits often consist of dynamic devices, which must be tested at a high rate of speed in order to function properly. This reduces the memory access time that can be tolerated, and memories with lower access times tend to be more expensive.

In light of this expense, certain schemes have been used in the past to reduce memory speed requirements. In many testers, for instance, the memory is several times as "wide" as the required vector. That is, enough information is stored at a single memory address to generate many vectors. A single memory access time is thus spread over many vectors. This multiplies the effective speed of vector retrieval without increasing the cost of the individual memory elements. When information is retrieved from the memory, it is stored briefly in intermediate registers from which the information is read rapidly one vector at a time. The result is that only the intermediate registers have to be especially fast; the large main memory, which causes the most expense, can be several times slower than the registers.

A further way to reduce memory cost is to design tests so that certain strings of vectors are used more than once. If such a test is used in a system that can jump between locations in memory instead of reading the contents from the memory locations strictly in the order of their addresses, certain portions of the memory can be used over and over again within the same test, thereby reducing the size and cost of the needed memory.

Although the ability to jump from memory location to memory location does reduce the size of the memory, some of the attendant reduction in memory expense is compromised because this type of organization places certain constraints on memory speed. Specifically, the access time must be low enough that the time taken to refill the intermediate tester registers after a jump does not delay retrieval of a vector from the registers by more time than can be tolerated between applications of vectors to the unit under test. Unless the tester stores all of the vectors in its memory one after another in the order in which they are to be applied, therefore, there has in the past been a lower limit on the speed of the memory that can be used.

Accordingly, an object of the present invention is to use relatively low-speed tester memories while permitting jumps from point to point in a memory so that portions of its contents can be reused.

SUMMARY OF THE INVENTION

The foregoing and related objects are achieved in a tester that is divided into a real-time machine and an advance-time machine with a first-in, first-out memory stack interposed between them. The real-time machine applies signals to and senses signals at the unit under test in accordance with codes that are passed to it. It performs these functions at a rate necessitated by the unit to be tested and the time requirements of the test.

The advance-time machine generates the codes that the real-time machine uses. However, the advance-time machine generates each code not at the rate at which the code is needed by the real-time machine, but at a rate determined by the speed of the particular process that it uses to generate the code. During some intervals, the real-time machine may need to receive vectors at a higher rate than that at which the advance-time machine produces them. According to the present invention, this ordinarily will not present a problem, because the advance-time machine applies its outputs to the first-in, first-out memory stacks, which accumulate a reservoir of vectors, obtaining them from the advance-time machine at the rates of which the advance-time machine is capable, and applying them to the real-time machine at the rates that the real-time machine requires. As a result, the advance-time machine can generate some vectors more slowly than the real-time machine requires them if it generates others fast enough that the average rate at which it generates codes is equal to the average rate at which signals must be applied to the unit under test.

BRIEF DESCRIPTION OF THE DRAWING

These and further features and advantages of the present invention are described in the single drawing FIGURE, which is a block diagram of a tester employing the teachings of the invention.

DETAILED DESCRIPTION OF THE PREFERRED EMBODIMENTS

The circuit tester 10 illustrated in the drawing includes an advance-time machine 12 for generating codes representing test-terminal states, a real-time machine 14 for interpreting those codes to place the test terminals in the desired states, and a data reservoir 16 that receives the state codes from the advance-time machine 12 and provides them to the real-time machine, which places tester terminals 18a–d in the states indicated by the state codes. According to the states in which the terminals 18a–d are placed, they apply signals to, or sense signals at, corresponding terminals 20a–d of a unit under test 22.

Although the rates at which the real-time machine 14 changes the signals that it applies to the unit under test 22 change from time to time, the rate is relatively constant as compared with the rates at which the advance-time machine 12 generates the corresponding codes. That is, the time between successive codes from the advance-time machine 12 is sometimes greater and sometimes less than the time between signal changes by the real-time machine 14. The reservoir 16 tends to smooth out these time differences; the amount of information in the reservoir 16 increases or decreases as the advance-time machine 12 produces codes faster or more slowly than the real-time machine 14 uses them. On average, however, the rate at which the advance-time machine produces codes is usually the same as that at which the real-time machine 14 uses them, because it pauses when the reservoir 16 gets full. As a result of this arrangement, the circuitry in the advance-time machine 12 for generating state codes does not have to be so fast that its slowest code production is as fast as the real-time machine's fastest code use. Consequently, the circuitry in the advance-time machine for generating state codes can be made of relatively low-cost circuit elements.

For the sake of example, the advance-time machine 12 is shown in the drawing as including individual code-generation circuits 24a–d associated with respective tester output terminals 18a–d. Code generator 24a, which is similar to code generators 24b–d, includes a memory 26 containing information concerning the states that the associated terminal 18a is to take. It also includes a data engine 28 for using the contents of the memory 26 to generate the code-vector component associated with the associated tester terminal. The memory 26 contains a relatively large amount of information, and it is thus desirable to keep the memory cost per bit relatively low. This memory is therefore arranged so that enough data are fetched from memory 26 in one access time to produce components of, say, four vectors, not just one. The memory 26 accordingly does not need to be accessed once for each vector; it only has to be accessed once for every four vectors. The memory element 26 can thus employ less-expensive moderate-speed memory rather than more-expensive high-speed memory.

The data engine 28 reads the information for four vector components in parallel and uses it to generate one vector component at a time, supplying the resultant codes to an associated first-in, first-out (FIFO) memory stack 30a. The data engine 28 may be little more than shift registers that are loaded in parallel and read out in series. On the other hand, they may be fairly complicated devices for reconstituting state codes from information stored in memory 34 in accordance with a data-reduction scheme.

The rate at which the data engine 28 generates these codes and stores them in the FIFO stack 30a is substantially independent of the rate at which the advance-time machine 14 uses them. Specifically, the data engine 28 keeps feeding new state codes into the FIFO stack 30a until that stack is full. It then waits until retrieval of information from the stack by a formatter 32a associated with tester terminal 18a creates room for further storage. Formatter 32a fetches codes at rates that are independent of those at which the codes are stored, and it interprets the codes to place terminal 18a in the state specified by the most recently fetched code.

The concept of employing a reservoir interposed between an advance-time code-generating machine and a real-time terminal-controlling machine can be used in a wide variety of circuit-tester organizations. In the particular type of organization shown in the drawing, the advance-time machine includes a data-engine controller 34 for sending control signals over line 36 to the several state-code generators 24a–d. It is this controller 34 that triggers each state-code generator 24 to generate a vector component each time a new code vector is to be produced; it thereby determines the code-generation timing.

The data-engine controller 34 can be arranged to perform other types of tasks, too. For instance, it could be used before a test to load the memories 26 with the necessary information. It might be employed to send to the data engines signals that affect the manner in which they interpret the information in their respective memories to generate state codes. Whatever these other functions may be, the timing with which the data-engine controller 34 calls for code-vector generation is relatively independent of the timing with which the resultant signals are applied to the terminals 20a–d of the unit under test 22.

In the exemplary tester organization depicted in the drawing, the reservoir 16 includes a further first-in, first-out (FIFO) memory stack 38. This FIFO stack receives information from the data-engine controller 34 rather than from an individual data engine 28. The FIFO stack 38 receives information to be interpreted by a formatter controller 40. The formatter controller 40 is the device that controls the timing with which the individual formatters 32a–d fetch codes from the FIFO stacks 30a–d and apply the resultant signals to the tester terminals 18a–d. It fetches information from FIFO stack 38 and uses it in generating signals that it sends over lines 42 to control the manner in which the individual formatters 32a–d interpret codes fetched from the individual FIFO stacks 30a–d.

It is the job of the formatters 32a–d to convert digital information received from the FIFO stacks 30a–d into the states that the tester pins 18a–d are to assume. Suppose, for instance, that the state codes are two-bit codes. A digital "00" may mean high, a digital "01" may mean low, a digital "10" may mean high impedance on output and "don't care" on input, and a digital "11" may be a reserved code or represent a further function. In accordance with previously stored information, one of the formatters 32a–d, upon receiving a "00," interprets it as, say, a voltage to be applied for a predetermined duration within the cycle in which the code is present. In other words, the resultant terminal state has many attributes not specified by the state code. These attributes are determined by parameters stored in the formatter to enable it to interpret the state code properly.

These parameters may be loaded into the formatters 32a–d by the formatter controller 40 during a programming procedure to program the tester for a particular type of circuit. In the alternative, these parameters may be hard-wired during formatter manufacture or provided in some other way. In any event, the formatter controller 40 sends further information during the test as to how to interpret the codes. Each formatter 32a–d, for instance, may have stored several sets of parameters, each set specifying a different way to interpret fetched codes. The formatter controller 40, on requesting application of the next signal vector, would also send a parameter group label. One parameter set in each formatter 32 would be associated with the parameter group label, and each formatter 32 would use the parameter set associated with the transmitted group label to interpret its state code.

To perform a test, the data-engine controller 34 begins sending signals over line 36 to cause the individual state-code generators 24 to generate state codes in accordance with information that they have previously stored. Most of these signals are simply commands to generate the next vector and place it into FIFO stacks 30a–d. Whenever the data-engine controller 34 sends such a generate-vector signal over lines 36, it also sends FIFO stack 38 a parameter group label that the formatter controller 40 will send to the various formatters 30a–d to indicate the parameter sets to use in interpreting the generated vector. For instance, the entry in FIFO stack 38 might indicate that the formatters 32a–d should use "parameter group B" to interpret the state codes. The parameters that one formatter 32a has stored as its Group B parameters would not in general be the same as the Group B parameters of some other formatters, but all formatters use whatever parameter set they respectively have associated with group label B.

The data-engine controller 34 might also send information to the data-code generators 24 concerning changes in the ways in which the data engines 28 are to assemble state codes from the information that they fetch from the memories 26. These instructions would affect the results of subsequent commands to generate vectors, but they would not themselves be instructions to generate another vector, and so the state-code generators 24 would not respond by placing a new vector into the FIFO stacks 30a–d. Accordingly, the data-engine controller 34 would not place a new entry into its FIFO stack 38.

After a number of entries have been made in the FIFO stacks 30 and 38, the formatter controller 40, with a timing that is independent of that of the data-engine controller 34, begins reading codes from its FIFO stack 38. It commands the individual formatters 32a–d to read state codes from their respective stacks 30a–d and interpret them in light of the stored parameter groups indicated by the code from stack 38. The formatters 32a–d accordingly fetch state codes and place their terminals in the states designated by the fetched codes. In accordance with these states, signals are applied to or sensed at the terminals 20a–d of the unit under test. By way of signal paths not shown in the drawing, the formatters 32a–d send to a host computer, also not shown, signals that indicate whether the sensed signals equal the expected signals represented by the state codes. If the sensed and expected signals are not equal, the circuit under test is identified as defective.

This procedure continues through the application of many vectors. The data-engine controller 34 continues, with its own timing, to store codes in FIFO stack 38 and cause the state-code generators 24a–d to store codes in their stacks 30a–d. Concurrently, the formatter controller 40 continues, with its own timing, to cause the formatters 32a–d to fetch codes from FIFO stacks 30a–d. If the stacks become filled up, the data-engine controller 34 pauses. Each time the formatter controller 40 and formatters 32a–d fetch codes from their respective FIFO stacks, more room is created in the FIFO stacks, and the data engines 24a–d and the data-engine controller 34 resume code generation to store codes in those stacks.

As was stated above, there are times when the formatters 32a–d fetch codes faster than the code generators 24a–d generate them, and the reservoir 16 tends to become depleted during these times. This is acceptable, however, if code generation is fast enough at other times to compensate and thus keep the FIFO stacks from becoming totally depleted. If the FIFO stacks never become totally depleted, the real-time machine 14 can perform its entire test without ever having to wait for the advance-time machine 12 to perform a relatively time-consuming code generation.

The principles illustrated above by reference to a specific embodiment can be applied to a wide variety of testers. Although the specific embodiment illustrates a relatively sophisticated organization, in which a data-engine controller has the ability to change the way in which a data-engine 28 interprets the information that it fetches from its memory 26, such an arrangement is not necessary in order to obtain the benefits of the present invention. Similarly, it is not necessary to use a formatter controller in the real-time engine that sends the formatters information by which they determine whether their respective tester pins are to be input or output states. It is only necessary to provide a reservoir between an advance-time machine for generating state codes and a real-time machine for interpreting those codes.

As a result of the foregoing description, it is clear that, through the use of the teachings of the present invention, it is possible to reduce the cost of tester memories significantly.

I claim:

1. In a circuit tester, having a plurality of tester terminals for connection to terminals of a unit under test, for performing a test by placing the terminals in a sequence of terminal states, control circuitry for controlling the terminal states of the tester terminals to specify the test operations to be performed, the control circuitry comprising:
   A. a first-in, first-out memory for storing state codes applied thereto;
   B. an advance-time machine for generating state codes representing terminal states and for applying those state codes to the first-in, first-out memory;
   C. a real-time machine for fetching those state codes from the first-in, first-out memory, and for placing the tester terminals in the states represented by the fetched state codes concurrently with the application of state codes to the first-in, first-out memory, and with a timing independent of that with which the advance-time machine applies state codes to the memory, so that the real-time machine places the terminals in the states represented by the state codes that the advance-time machine generates, whereby the control circuitry can change terminal states at a rate different from that at which it generates state codes.

2. A circuit tester as recited in claim 1 wherein:
   A. the first-in, first-out memory includes an individual first-in, first-out stack associated with each tester terminal;
   B. the advance-time machine includes an individual state-code generator associated with each tester terminal for generating a sequence of state codes for its associated tester terminal and for applying those state codes to the individual first-in, first-out stack associated with that tester terminal; and
   C. the real-time machine includes a formatter associated with each tester terminal for fetching from the first-in, first-out stack associated with the same tester terminal the earliest state code applied thereto and not previously fetched and for placing its associated tester terminal in the state represented by the fetched state code.

* * * * *